United States Patent [19]

Dietz et al.

[11] Patent Number: 4,459,166
[45] Date of Patent: Jul. 10, 1984

[54] METHOD OF BONDING AN ELECTRONIC DEVICE TO A CERAMIC SUBSTRATE

[75] Inventors: Raymond L. Dietz, Poway; Michael Featherby, San Diego; Peter K. Margetts, El Cajon, all of Calif.

[73] Assignee: Johnson Matthey Inc., Malvern, Pa.

[21] Appl. No.: 494,872

[22] Filed: May 16, 1983

Related U.S. Application Data

[60] Division of Ser. No. 355,719, Mar. 8, 1982, Pat. No. 4,401,768, which is a continuation-in-part of Ser. No. 287,892, Aug. 3, 1981, abandoned.

[51] Int. Cl.³ ............... B32B 31/04; C03C 3/10; H05K 7/06; H01L 23/10
[52] U.S. Cl. ............... 156/89; 106/1.13; 106/1.14; 106/285; 106/290; 156/325; 252/514; 357/67; 357/75; 361/400; 361/411; 428/208; 428/209; 428/210; 428/448; 501/19; 501/20; 501/22; 501/75; 501/76
[58] Field of Search ............ 156/89, 325; 428/208, 428/209, 210, 448; 106/1.13, 1.14, 285, 290; 252/514; 501/19, 20, 22, 75, 76, 26, 15; 361/400, 411; 357/67, 75

[56] References Cited

U.S. PATENT DOCUMENTS

| | | | |
|---|---|---|---|
| 2,385,580 | 9/1945 | Knox | 501/19 |
| 2,530,217 | 11/1950 | Bain | 501/75 |
| 3,047,409 | 7/1962 | Slayter et al. | 501/75 |
| 3,207,706 | 9/1965 | Hoffman | 501/26 |
| 3,440,182 | 4/1969 | Hoffman | 501/19 |
| 3,480,566 | 11/1969 | Hoffman | 501/75 |
| 3,484,284 | 12/1969 | Dates et al. | 106/1.14 |
| 3,497,774 | 2/1970 | Hornberger et al. | 357/67 |
| 3,944,696 | 3/1976 | Larry | 501/19 |
| 3,975,201 | 8/1976 | Greenstein | 501/15 |
| 4,002,799 | 1/1977 | Dumesnil | 501/76 |
| 4,032,350 | 6/1977 | Greenstein | 252/514 |
| 4,054,714 | 10/1977 | Mastrangelo | 252/514 |
| 4,101,710 | 7/1978 | Marcus | 252/514 |
| 4,142,203 | 2/1979 | Dietz | 357/67 |

FOREIGN PATENT DOCUMENTS

| | | | |
|---|---|---|---|
| 8782 | 3/1980 | European Pat. Off. | 252/514 |
| 3301 | of 1882 | United Kingdom | 501/75 |
| 625466 | 6/1949 | United Kingdom | 501/76 |
| 792293 | 12/1980 | U.S.S.R. | 252/514 |

OTHER PUBLICATIONS

Greenwood, R. W., "Silver Bearing Conductive Pastes", IBM Tech. Discl. Bulletin, Jul. 1974, 17, (2), p. 437.

Geller, R. F. et al., Some "Soft" Glazes of Low Thermal Expansion–J. of Research of National Bur. of Stand., 20 Jan. 1938, p. 61, Res. Paper 1064, Density Measurements of Powders used in Paste for the Microelectronics Industry.

Scramaglia, R., "Powder Properties Affect Fired Film" Ceramic Industry, 119 (5), Nov. 1982, pp. 44–46.

Primary Examiner—Caleb Weston
Attorney, Agent, or Firm—James J. Burke, II

[57] ABSTRACT

A silver metallizing paste for attachment of silicon semiconductive devices in lead-frame packages, specifically ceramic packages, which is less expensive than a gold preform but useable in hermetic packages, and provides better electrical and thermal conductivity, and higher bond strength, than silver polyimides. From 25 to 95% of silver is blended with a low-melting glass, preferably one having 95-96% PbO, and a paste or ink is formed with a suitable vehicle at 75-85% solids. Use of the paste follows conventional practice. Selection of Ag:-glass ratio depends on the type of die bonding to be used. The paste is particularly useful in MOS technology, where low contact resistance is required, and also finds applications as a solder substitute and bonding chip capacitors. It is most advantageous in attachment of larger-area integrated circuits in that stress cracking associated with the gold-silicon eutectic is avoided.

7 Claims, 1 Drawing Figure

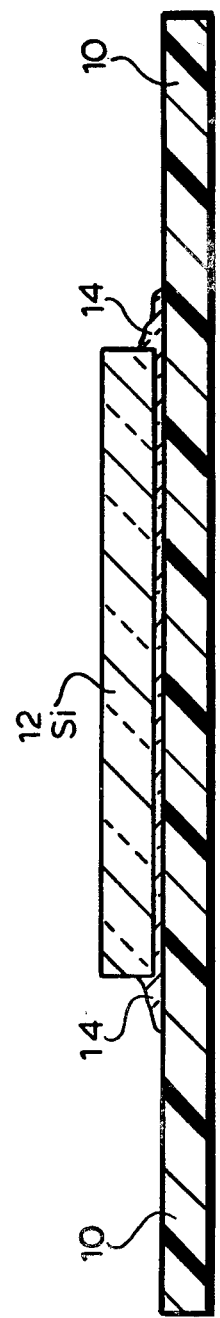

METHOD OF BONDING AN ELECTRONIC DEVICE TO A CERAMIC SUBSTRATE

RELATED APPLICATIONS

This application is a division of application Ser. No. 355,719, filed Mar. 8, 1982, now U.S. Pat. No. 4,401,768 issued Aug. 30, 1983 which was a continuation-in-part of application Ser. No. 287,892, filed Aug. 3, 1981, now abandoned.

BACKGROUND OF THE INVENTION

The present invention relates generally to silver metallizations and, more particularly, the invention relates to a silver-filled glass composition specifically adapted to bond silicon semiconductive devices to substrates.

Silver metallization compositions had their origins in decorative enamelling, but were adapted early on for use in thick film hybrid circuitry. The attention of early workers was, however, concentrated on designing compositions that would adhere strongly to the ceramic substrate. The so-called "Scotch tape test" became an early standard of adhesion. Knox, U.S. Pat. No. 2,385,580 disclosed high proportions of bismuth oxide in lead borosilicate glasses which was widely used with silver, but was not satisfactory with other noble metals. Hoffman, U.S. Pat. No. 3,440,182 disclosed additions of vanadium and copper oxides as improving adhesion, solderability and conductivity of noble metal metallizing compositions generally. These compositions were used as conductors, rather than as a medium for attachment of devices such as silicon integrated circuits to the substrates.

In the latter category, gold-based inks or preforms have been the most common, taking advantage of the low-temperature gold-silicon eutectic to achieve a good bond. Even though very substantial efforts have been made to reduce the amount of gold used to make such bonds, its expense mitigates against its use wherever possible.

There has been a great deal of effort over the years to eliminate gold from hermetic packages in the electronics industry. One of the more difficult areas to eliminate gold has been in MOS technology, due to the necessity of having backside low resistance contact; as of now, gold is still the material of choice in this application.

Plastic packaging has nearly eliminated the necessity for gold, with the exceptions of gold bonding wire and gold evaporated on the backside of the wafer. The gold on the frame and gold preform have been eliminated by the use of epoxy and polyimides filled with silver flake in such packages.

Silver-filled polyimides have been used for die attachment in hermetic packages. Because of the problem of final cross linking of polyimides, and the generation of $CO_2$ and $H_2O$ during sealing, this has not achieved significant volume.

There are no low-temperature phases in the silver-gold system, which is a continuous series of solid solutions, and the silver-silicon system has a eutectic but a high temperature one (over 800° C.), so systems based on silver must employ a fundamentally different bonding mechanism, indeed one where the silver per se plays little or no part.

Thus, where a gold preform is used to attach a silicon die to a silver metallized surface, the mechanism on one side is the gold-silicon eutectic and on the other it is a solid-liquid diffusion, with the glass playing the major role in terms of bond strength. Being less than a metallurgical bond, the thermal and electrical conductivity are not as good as desired.

Pure glass bonds have also been used in this service, but without a conductive element both conductivities suffer, as would be expected.

Regarding silver polyimide compositions, the quantity of silver that can be incorporated is limited, and special processing is necessary (for high-volume manufacturing, uniformity of processing is an important cost consideration). The biggest drawback of polyimides, or any organic bonding system, is that they can not be used in hermetic packages such as Cerdips, because they are moisture getters, can not be outgassed, and generally can not withstand high temperature used in assembling these packages.

The present invention provides a silver-filled glass that produces strong bonds between the silicon die and the substrate, whether or not the latter is metallized, with controllable thermal and electrical conductivity, and which may be used in hermetic packages.

OBJECTS OF THE INVENTION

A general object of the present invention is to provide an improved medium for bonding silicon dies to substrates.

A further object of the present invention is to provide a silver-filled glass adapted to make strong bonds between silicon dies and metallized or bare substrates under normal processing conditions.

Yet another object of the present invention is to provide a silver-filled glass for bonding silicon dies to substrates that is lower in cost than gold-based systems, higher in conductivity and bond strength than other silver or non-metallic systems, and which is adapted for use in hermetic packages.

Another object of the invention is to provide a silver-filled glass useful as a solder-substitute and for bonding capacitor chips to substrates.

A still further object of the invention is to provide a silver-filled glass for bonding silicon dies to alumina substrates that is as good as gold-silicon eutectic bonds in terms of adhesion but which is lower in thermally induced stresses than eutectic bonds.

Various other objects and advantages of the invention will become clear from the following description of embodiments, and the novel features will be particularly pointed out in connection with the appended claims.

THE DRAWING

Reference will hereinafter be made to the accompanying drawing, which is a cross-sectional elevation of a silicon die bonded on a ceramic substrate in accordance with the invention.

DESCRIPTION OF EMBODIMENTS

In the selection of a silver powder for use with the invention, it has been determined that both sperical and flake powders function well, though the latter produces a shinier, more metallic-looking finish. It is of interest that some prior workers specified flake for silver conductives, but that was for a current-carrying "wire" rather than a bonding medium, where conductivity is through the thickness, rather than along the length.

Satisfactory silvers for the invention are those having a surface area in the range of 0.2 to 1 $m^2/gm$, and a tap density of 2.2 to 2.8 g/cc.

The glass is the second key component, and it is essential that it be low-melting, so as to be molten at the die-attach temperature, 425°–450° C. The preferred glass selected meets this requirement, has a softening temperature of 325° C., and the following composition:

PbO: 95–96%
$SiO_2$: 0.25–2.5%
$B_2O_3$: remainder

It has been found that small quantities of ZnO, under 0.5%, are not deleterious, but any sodium should be rigorously avoided, as it attacks silicon. While bismuth oxide can also be incorporated in low-melting glasses, it is harder to mill than lead oxide, and will attack platinum used in formulation procedures. Thus, substitution of bismuth for lead is not advised.

The glass is fritted and ground in a high-purity alumina jar mill to meet the following specifications:

surface area: 0.3–0.6 $m^2/gm$
tap density: 2.8–3.6 g/cc

Generally, glasses having a softening point in the range of 325° to 425° C., and a coefficient of thermal expansion no higher than about 13 ppm/°C., preferably in the range of 8–13 ppm/°C., may be used.

The softening point should be at least 325° C. to insure that all organics are burned off. If the softening point is higher than 425° C., the glass will not be sufficiently fluid at the die attach temperature. The glass is then mixed with the vehicle described hereinbelow (80% solids) and milled on a 3-roll mill to a particle size (F.O.G.) of 7–8 microns.

Those skilled in the art appreciate that the selection of vehicle is not critical, and a variety of appropriate vehicles are readily available. Of course, burn-out must be complete at the indicated temperatures. In this case the vehicle selected comprised:

Ethyl methacrylate: 12%
Terpineol: 88%

The silver is then added to the glass paste in a desired silver:glass ratio as discussed below, but falling within the limits 25:75 to 95:5. The percent (total) solids is then adjusted to within the range of 75–85% by addition of more of the vehicle. Outside of this range, rheological problems are likely to be encountered; generally a solid content in the range of 80–83% is preferred. At this level, typically, the paste will have a viscosity of 20–22 Kcps, as measured on a Brookfield RVT Viscometer, with a TF spindle, at 20 RPM and 25° C.

Use of the paste is essentially conventional. Depending on use, a dot, square or screened area of the paste is applied on a metallized or bare film (ceramic) substrate, machine dispensing, screen printing or stamping techniques all being useable. If it is dotted, the size of the dot is about 25% larger than the die. The die is attached by placing the die in the center of the wet paste and "setting" it by applying pressure, so that the paste flows about half way up the side of the die and leaves a thin film under the die. Drying in an oven is carried out at 50°–75° C. for 20–40 minutes. Organic burn-out is done on a cycle time of 15–20 minutes, with 2–3 minutes at a peak temperature in the range of 325°–450° C. In the accompanying drawing, a substrate 10 is shown with a die 12 attached thereto with a layer of silver filled glass 14, which has flowed up around the edges during "setting". For test purposes, the package is subjected to a simulated (package) sealing cycle in the range of 430° to 525° C., with 15 minutes at 430° C.

Alternatively, the die may be attached by known scrubbing techniques, or hot-stage vibratory bonding may be employed.

A surprising aspect of the invention is that the mechanical strength of the bond is proportional to the silver content. Using a standard push test (Mil. Spec. 883B, method 2019.1), a range of 5 to 17 lbs. was recorded through the silver range of 30 to 95%. As would be expected, electrical conductivity also improves with silver content. At the low end, resistivity is comparable to the commercial epoxies (25–35 $\mu$ohm. cm) for example EPO-TEK P-10, and this drops to 5–10 $\mu$ohm. cm at high silver levels.

When the substrate has been metallized, acceptable bonds are achieved at Ag:glass ratios of 25:75 to 95:5. On bare alumina, it is preferred to keep the ratio between 50:50 and 90:10. Note that "acceptable" is here defined as well above the mil spec of 4.2 lbs.

With both bond strength and conductivity rising with silver content a question could be raised as to utility of the low-silver, high-glass compositions. The answer, generally, depends on intended use. More particularly, when the die is to be attached by mechanical scrubbing means, very good bonds are achieved with silver in the 25–40% range. In situations where it is desired to have the die sink into the ink to a degree, the higher silver ratios are preferred. At the very high silver end (e.g. 75–95%), tests indicate that the ink can be applied to a bare substrate and the chip can be ultrasonically downbonded with good results. One would not want to go much above 90% silver as adhesion will start to drop off. There are thus a variety of possibilities, including elimination of certain processing steps, by, for example, attaching lead frames and dies at the same time.

It is possible to substitute certain base metals for a portion of the silver but, generally, adhesion will drop and resistivity will rise with such substitution. Specifically, up to 10% Ni, up to 60% Sn and up to about 20% Cu were substituted and resulted in acceptable bond strengths, providing firing was carried out in air, not nitrogen, and at a combined metal:glass ratio of 80:20 (nitrogen firing reduces the lead oxide and destroys the glass).

An important aspect of the invention is its applicability to the larger integrated circuits now coming into use. More particularly, it is known that the gold-silicon eutectic is a brittle intermetallic, and that any bonding material must accommodate the different thermal expansion rates of the die and the substrate. This is not a notable problem with small chips, but in the VLSIC range the sealing cycle temperature can cause both bond failure and chip cracking due to thermal stress. Because the composition of the present invention softens rather than melts, such thermal stresses are avoided, as has been shown by thermal shock test (mil spec standard 883B, condition A).

Lastly, the question arises as to whether there might be applications of the invention where it would be desireable to substitute a noble metal, particularly gold, for a portion of the silver. It was found that no particular advantages accrued by this expedient. More particularly, a standard gold paste was mixed with an 80:20 Ag:glass paste of the invention in proportions that ranged from a Au:Ag ratio of 10/90 to 80/20. While the conductivity of bonds to chips showed some tendency to rise with higher gold, results were inconclusive, and there was clearly no cost justification for such substitution. Moreover, the shear strength of the bonds tended to drop at higher gold, though it was acceptable at any level. No gold-silicon eutectic was observed, presumably due to features of the Au—Ag—Si ternary phase diagram. There is thus no apparent reason to sacrifice the considerable economies of the invention by trading-off silver for gold.

A further important application of the invention is in bonding chip capacitors to substrates. For example, a 120×90×35 mil capacitor is "set" in a 5-7 mil pad of the silver-filled glass of the invention, dried and fired as noted above. Shear strength was 13.8 lb., and a good electrical contact was made around the sides. In terms of hybrid circuit manufacture, this has important ramifications, to wit, circuit chips and capacitors can be attached, dried and fired in a single cycle, with good bonds. Moreover, subsequent processing or operation may be carried out at temperatures that would melt conventional solder pastes.

A further application for the invention is as a substitute for solder. More particularly, at the preferred 80:20 Ag:glass ratio, and the 80-85% solids content, the composition of the invention will "hold" the device to be soldered through the firing cycle, whereas solders will allow movement.

Various changes in the details, steps, materials and arrangements of parts, which have been herein described and illustrated to explain the nature of the invention, may be made by those skilled in the art within the principle and scope of the invention as defined in the appended claims.

What is claimed is:

1. The method of bonding an electronic device to a ceramic substrate comprising:
    applying a silver-filled glass metallizing composition onto said substrate, said glass consisting essentially of:
        25 to 95% of silver powder having a surface area of about 0.2 to 1.0 $m^2$/gm and a tap density of about 2.2 to 2.8 gm/cc;
        75 to 5% of high-lead, borosilicate substantially sodium-free glass frit having a softening temperature in the range of 325° to 425° C., a coefficient of thermal expansion no higher than about 13 ppm/°C., a surface area in the range of about 0.3 to 0.6 $m^2$/gm, and a tap density in the range of about 2.8 to 3.6 gm/cc;
        a suitable liquid organic vehicle in an amount sufficient to establish the percent solids in said paste in the range of about 75 to 85%;
    setting said device into said metallizing composition with pressure to form an assembly;
    drying said assembly;
    firing said assembly at a peak temperature in the range of 425° to 525° C.

2. The method as claimed in claim 1, wherein said glass comprises about 95% PbO.

3. The method as claimed in claim 1, wherein the silver:glass ratio in said metallizing composition is about 80:20.

4. The method as claimed in claim 1, wherein said glass consists essentially of:
    PbO: 95–96%
    $SiO_2$: 0.5–2.5%
    $B_2O_3$: remainder.

5. The method as claimed in claim 1, wherein said electronic device is a silicon die.

6. The method as claimed in claim 1, wherein said electronic device is a chip capacitor.

7. The method as claimed in claim 1, wherein a portion of the silver in said metallizing composition is replaced by a metal selected from the group consisting of nickel, tin and copper, up to the following limits:
    Ni: up to 10%
    Sn: up to 60%
    Cu: up to 20%.

* * * * *